(12) United States Patent
Kato et al.

(10) Patent No.: US 6,309,166 B1
(45) Date of Patent: Oct. 30, 2001

(54) WAFER TRANSFER DEVICE

(75) Inventors: Tomoo Kato, Hachioji; Keiji Kimura, Machida, both of (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/319,633

(22) PCT Filed: Oct. 13, 1998

(86) PCT No.: PCT/JP98/04616

§ 371 Date: Jun. 8, 1999

§ 102(e) Date: Jun. 8, 1999

(87) PCT Pub. No.: WO99/21223

PCT Pub. Date: Apr. 29, 1999

(30) Foreign Application Priority Data

Oct. 17, 1997 (JP) .................................................... 9-285291

(51) Int. Cl.⁷ .................................................. B65G 49/07
(52) U.S. Cl. ................ 414/416.09; 414/937; 414/222.1; 414/331.16
(58) Field of Search .......................... 414/222.1, 222.12, 414/331.16, 331.18, 417, 936, 937, 416.04, 416.09

(56) References Cited

U.S. PATENT DOCUMENTS

| | | | | |
|---|---|---|---|---|
| 4,311,427 | * | 1/1982 | Coad et al. | 414/417 |
| 5,102,291 | * | 4/1992 | Hine | 414/417 |
| 5,183,378 | * | 2/1993 | Asano et al. | 414/417 |
| 5,759,007 | * | 6/1998 | Nichols et al. | 414/417 |
| 5,853,284 | * | 12/1998 | Ohzeki et al. | 414/936 |
| 5,970,818 | * | 10/1999 | Kikuchi et al. | 414/936 |

FOREIGN PATENT DOCUMENTS

| | | | | |
|---|---|---|---|---|
| 2626261 | * | 7/1989 | (FR) | 414/417 |
| 144022 | * | 8/1983 | (JP) | 414/417 |
| 2122541 | * | 5/1990 | (JP) | 414/936 |
| 3-95652 | | 9/1991 | (JP) . | |
| 8-139162 | | 5/1996 | (JP) . | |
| 8-306762 | | 11/1996 | (JP) . | |

* cited by examiner

*Primary Examiner*—James W. Keenan
(74) *Attorney, Agent, or Firm*—Frishauf, Holtz, Goodman, Langer & Chick, P.C.

(57) ABSTRACT

A wafer transfer apparatus for taking out a wafer from a wafer cassette having grooves on both ends for holding circumferential edges of a plurality of wafers by moving a wafer transfer arm in height directions and back and forth directions relative to the wafer cassette. The apparatus comprises a wafer pushing out mechanism for pushing out a wafer on the back of a wafer inlet/outlet side of the wafer cassette into which the transfer arm is inserted. The wafer pushing out mechanism comprises a pushing pin rotatable when it is in contact with the wafer and a driving mechanism for driving the pushing pin so as to push the wafer from the back of the wafer cassette to the wafer inlet/outlet side.

17 Claims, 6 Drawing Sheets

WAFER TRANSFER DEVICE

TECHNICAL FIELD

The present invention relates to a wafer transfer apparatus for taking out a wafer from a wafer cassette and transfer it to another apparatus, if necessary, in order to inspect it or subject it to a subsequent process.

BACKGROUND ART

FIG. 8 shows an example of conventional wafer transfer apparatuses for taking out a wafer from a wafer cassette by means of a transfer arm. More specifically, a wafer cassette 4 storing a number of wafers 3 is mounted on a cassette base 2 movable up and down by an elevator mechanism portion 1, such that a wafer-inlet/outlet side faces a transfer arm 5 having an attracting portion 6. The transfer arm 5 has a general structure movable forward and backward relative to the wafer cassette 4.

An operation of the conventional wafer transfer apparatus will be described in brief. First, the cassette base 2 is moved down by the elevator mechanism portion 1, and the number of detected wafers is counted by sensors (not shown), thereby detecting a wafer 3 to be transferred. After the sensor detects the wafer 3, the cassette base 2 is moved up by a predetermined amount, and the transfer arm 5 is moved toward the wafer cassette 4 and inserted under the wafer 3 to be transferred. After the transfer arm 5 is inserted, the cassette base 2 is moved down by a predetermined amount by means of the elevator mechanism portion 1, so that the wafer to be transferred is placed on the transfer arm 5. Then, the wafer 3 to be transferred is attracted by the attracting portion 6, the transfer arm 5 is drawn out of the wafer cassette 4, and the wafer 3 to be transferred is extracted and transferred to a next step, such as an inspecting step.

In the wafer transfer apparatus described above, a plurality of slot grooves 7, for holding the wafers 3 horizontally, are formed in both side walls in the wafer cassette 4 for storing the wafers 3. A view encircled in a right portion of FIG. 8 is an enlarged view showing slot grooves 7 in the right side wall of the wafer cassette 4 viewed from the wafer 3-inlet/outlet side. As shown in the drawing, the cross section of a slot groove is a tapered trapezoid, so that the area in which a circumferential edge portion of the wafer 3 contacts to the groove can be as small as possible, to reduce the friction between the groove 7 and the wafer 3, keep the wafer 3 horizontally and make it easy to take in and out the wafer 3.

FIG. 9 is a cross sectional view of the wafer cassette 4 storing the wafers 3, taken along a line between slots and viewed from a position above the apparatus. The top side of FIG. 9 corresponds to the wafer-inlet/outlet side. The dot line represents a walls connecting member provided on a bottom portion of the cassette 4.

As shown in FIG. 9, the cassette 4 has a trapezoidal shape, the width of which decreases toward the back side, for the purpose of preventing the wafer 3 from dropping down, when the disk-shaped wafer 3 is stored in each slot groove 7. More specifically, a back-side opening 8, which opens in the back side of the wafer cassette 4 (the bottom side of FIG. 9), is narrower than the diameter of the wafer 3, so that the wafer 3 is brought into contact with back-around portions 701. Thus, the wafer is prevented from dropping down from the back side of the wafer cassette 4.

Recently, the wafers have become thinner with the improvement of the technique of polishing the wafers 3 and by the request of the users. For example, a standard thickness of a conventional wafer 3 was about 0.6 mm, whereas a recent wafer can be polished to a thickness of about 0.1 mm. As the wafer 3 is thinned, a back circumferential edge portion of the wafer 3 is wedged into the back-around portions 701 of the wafer cassette 4.

The wedged state of the circumferential edge portion of the wafer 3 into the back-around portions 701 poses the following problems.

(1) When the wafer 3 is moved up by the transfer arm 5, in the state where the back edge portion of the wafer 3 is wedged into the back-around portions 701, the wafer 3 is bent by force, resulting in damage of the wafer.

(2) When the back circumferential edge portion of the wafer 3 is wedged into the back-around portions 701, the wafer 3 is frequently stored with a forward or backward inclination. Therefore, it is possible that a space is left between the transfer arm 5 and the wafer 3, resulting in an error in attraction by the attracting portion 6.

(3) The wafer cassette 4 storing wafers 3 is transferred between different steps and factories with the wafer-inlet/outlet side facing up. Therefore, the back circumferential edge portion of the wafer 3 may probably be wedged into the back-around portions 701 due to its own weight.

When the wafers are transferred by a truck or an airplane, they are moved by a transport cassette having a narrower slot width, in consideration of instability during transportation, such as vibration. When they are replaced from the transport cassette to a transfer cassette by the transfer arm or the transport cassette is used as a transfer cassette without replacement, it is highly possible that the back circumferential edge portion of the wafer 3 is wedged into the back-around portions 701 and the wafer 3 is stored with a forward or backward inclination. When the wafer 3 which is not held horizontally is to be transferred by the transfer arm, since the distance between wafers is narrow, the transfer arm 5 easily interferes with the wafer 3. In addition, an attraction error may be caused.

On the other hand, in a case where the wafers are replaced from the transport cassette to a transfer cassette, the engagement must be released manually to replace the wafers, which requires a troublesome process.

DISCLOSURE OF INVENTION

The present invention was made in consideration of the above situations, and its object is to provide a wafer transfer apparatus which can release the engagement of a wafer with a slot groove, thereby surely preventing the wafer from being damaged during transfer of the wafer, and preventing an attraction error due to the engagement.

The present invention provides a wafer transfer apparatus for taking out a wafer from a wafer cassette having grooves on both ends for holding circumferential edges of a plurality of wafers by moving a wafer taking out arm relative to the wafer cassette, the wafer transfer apparatus comprising wafer pushing out means for pushing out a wafer engaged with the groove of the wafer cassette, thereby releasing engagement. The wafer pushing out means have engagement preventing means for preventing a wafer from engaging with a contact portion in contact with the wafer.

With this structure, the wafer is pushed out by the wafer pushing out means. Therefore, the engagement of the circumferential edge portion of the wafer with a groove of the wafer cassette can be released and the wafer can be hold horizontally with the grooves. As a result, when the wafer is taken out from the wafer cassette, damage of the wafer or an attraction error of the transfer arm can be prevented. Further, wafers can be smoothly moved from one wafer cassette to another, and a transfer process can be performed even by a transport wafer cassette which has a narrow pitch width.

It is preferable that the engagement preventing means be a roller having a rotatable contact portion in contact with the wafer.

Further, it is preferable that the wafer pushing out means comprise moving means for pushing out the contact portion in contact with the wafer to the wafer inlet/outlet side of the wafer cassette and driving means for linearly driving the moving means toward the wafer cassette.

With this structure, the engagement of the wafer with the groove of the wafer cassette is automatically released by driving the driving means, so that the wafer can be pushed out to the wafer inlet/outlet side. Therefore, if the wafer pushing out means is incorporated in the wafer transfer process, it is possible to perform wafer transfer free from wafer damage or an attraction error of the transfer arm.

Furthermore, the wafer pushing out means may be characterized in simultaneously pushing out a plurality of wafers.

With this structure, it is also possible to release at a time the engagement of all wafers stored in the wafer cassette, resulting in improvement of the efficiency of the transfer process.

Moreover, the wafer pushing out means may comprise moving means for pushing out the contact portion in contact with the wafer to the wafer inlet/outlet side of the wafer cassette, and have a structure in which the moving means is manually driven linearly toward the wafer cassette, thereby simultaneously pushing out a plurality of wafers.

With this structure, the structure can be simplified and a low-cost wafer transfer apparatus can be realized.

BEST MODE OF CARRYING OUT THE INVENTION

First to third embodiments of the present invention will be described with reference to the accompanying drawings.

Figure 8:
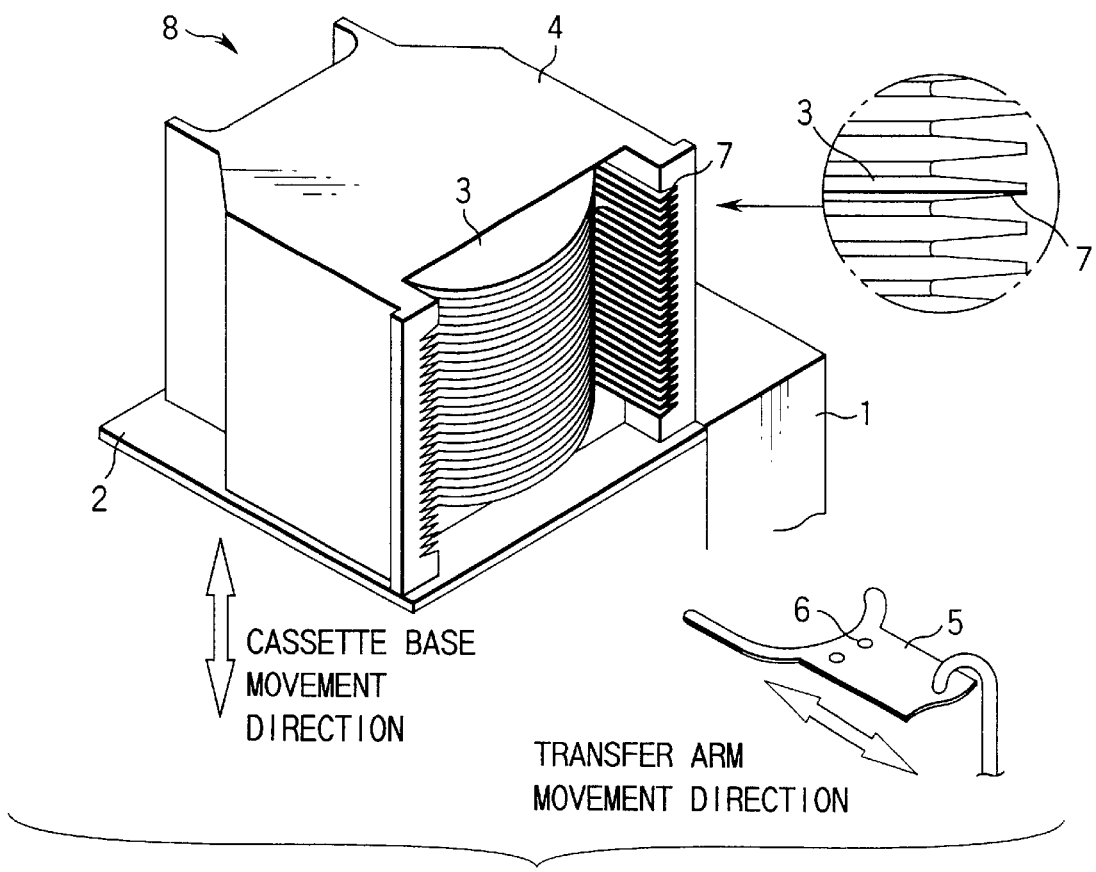
FIG. 8. shows the overall structure of a conventional wafer transfer apparatus.

The basic structure of wafer transfer apparatuses of the first and second embodiments of the present invention is the same as that described above with reference to FIG. 8 except for a wafer pushing mechanism. Therefore, FIG. 8 is invoked.

First Embodiment

Figure 1:
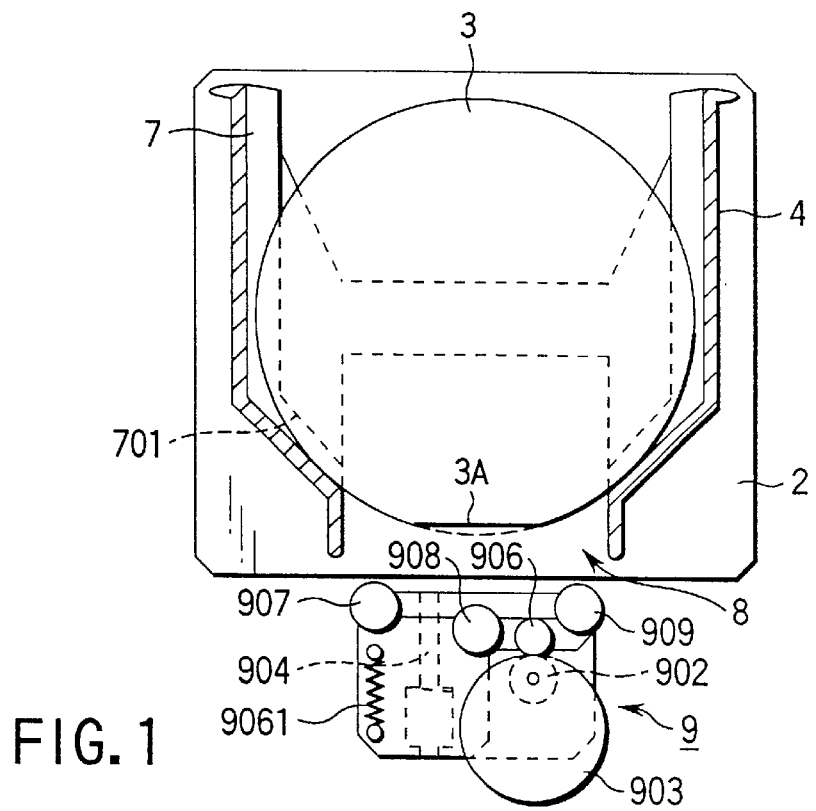
FIG. 1 shows a structure of a wafer pushing mechanism during a pushing standby time, used in a first embodiment.
Figure 2:
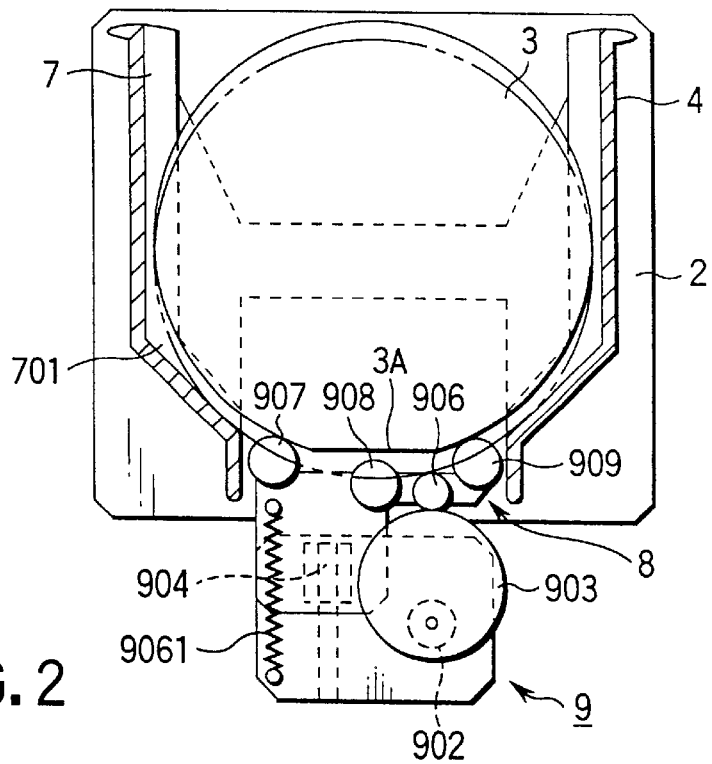
FIG. 2 shows a structure of the wafer pushing mechanism during a pushing time, used in the first embodiment.
Figure 9:
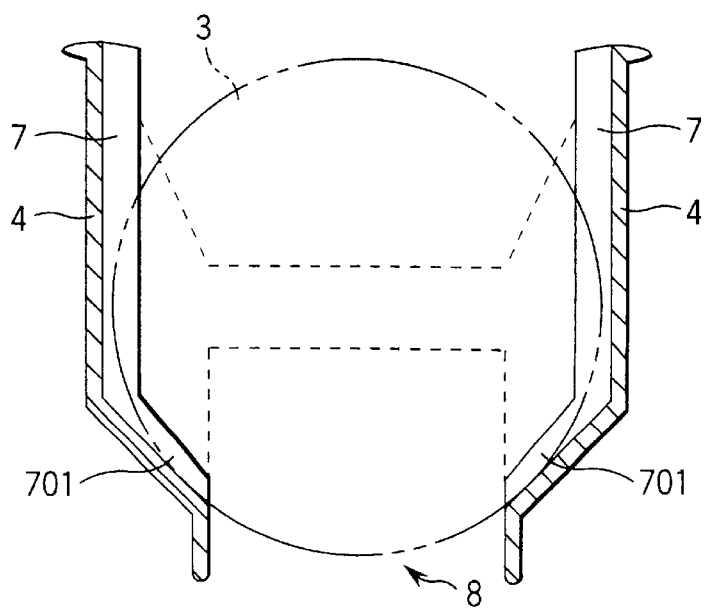
FIG. 9 shows the relationship between a slot groove and a wafer of a conventional wafer cassette.

FIGS. 1 and 2 show a wafer transfer apparatus according to the first embodiment of the present invention on a cross section similar to that shown in FIG. 9. The wafer transfer apparatus has a wafer pushing mechanism 9, which faces a back-side opening 8 of a wafer cassette 4 storing wafers 3. FIG. 1 shows a pushing standby time of the wafer pushing mechanism 9, whereas FIG. 2 shows a pushing time of the wafer pushing mechanism 9.

A general structure of the wafer pushing mechanism 9 will be described first.

Figure 3A:
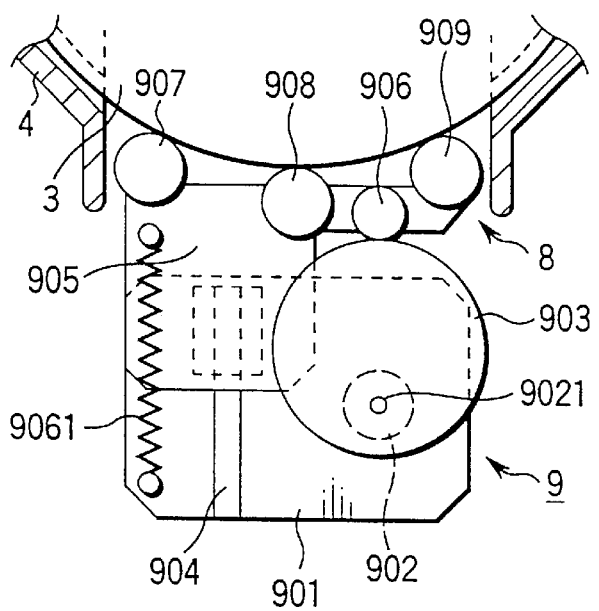
FIGS. 3A and 3B show the wafer pushing mechanism used in the first embodiment.
Figure 3B:
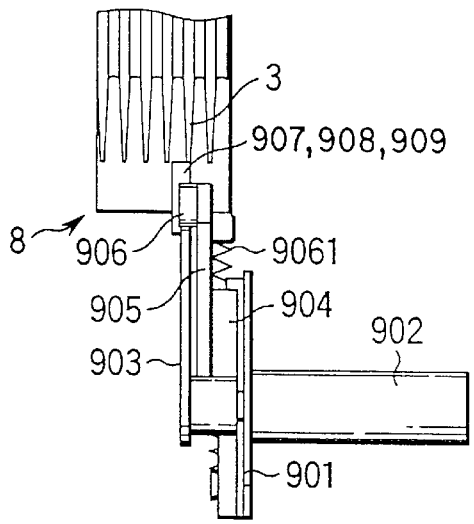
Figure 3C:
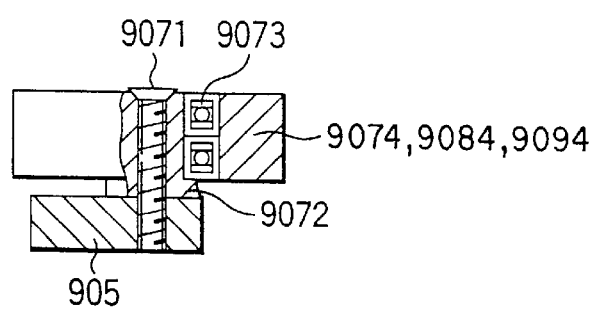
FIG. 3C shows a pushing pin used in the wafer pushing mechanism of the first embodiment.

FIGS. 3A, 3B and 3C show a general structure of the wafer pushing mechanism 9 shown in FIGS. 1 and 2. FIG. 3A is an enlarged view of the wafer pushing mechanism 9 shown in FIG. 2, FIG. 3B is a side view of FIG. 3A, and FIG. 3C is a cross sectional view of a pushing pin 907.

As shown in FIGS. 3A and 3B, the wafer pushing mechanism 9 comprises a base 901. Under the base 901, a motor 902 is provided. A rotation shaft 9021 of the motor 902 protrudes above the base 901. A disk-shaped cam 903 is eccentrically attached to the protruding rotation shaft 9021.

A sub-base 905 is attached to the base 901 via a linear movement guide 904. The sub-base 905 is forced by a spring 9061 in a direction in which it is attracted to the side of the base 901. A cam follower 906 is attached to the sub-base 905 so as to be kept in contact with the circumferential edge of the diskshaped cam 903. When the disk-shaped cam 903 is rotated by the motor 902, the sub-base 905 is moved linearly in a direction along the linear movement guide 904 against the attractive force of the spring 9061. The linear movement guide 904 is arranged to face the front of the back-side opening 8, such that the direction of the movement of the sub-base 905 along the linear guide 904 coincides with the direction in which the wafer cassette 4 pushes the wafer 3.

Further, a plurality of (three, in the depicted example) push pins 907, 908 and 909 are implanted in the sub-space 905 in a positional relationship such that they are in contact with the circumferential edge of the wafer 3.

In the first embodiment, the implantation interval between the pushing pins 907 and 909 is wider than the orientation flat (hereinafter referred to as the ori-fla) of the wafer 3. If the wafer is stored in the cassette 4 such that the ori-fla of the wafer 3 is present between the pushing pins 907 and 909, as will be described later, the two pushing pins push the wafer 3 out (the pin 908 does not contact to the wafer (ori-fla)). If the wafer is stored in the cassette 4 such that the ori-fla is present in a portion other than the portion between the pushing pins 907 and 909, the three pushing pins 907, 908 and 908 push the wafer 3 along the arc of the wafer 3. Therefore, the wafer can be pushed by a constant amount regardless of the position of the ori-fla.

A general structure of the pushing pin 907 will be described next. The pushing pins 908 and 909 also have completely the same structure.

As shown in FIG. 3C, a shaft 9072 is fixed to the is sub base 905 by a fixing bolt 9071. A pushing pin body 9074, made of resin, is rotatably attached to the shaft 9071 via bearings 9073. Since the pushing pin body 9074 is rotatable when the wafer 3 is pressed by the pushing pin body 9074, variable positions thereof are brought into contact with the circumferential edge of the wafer 3, so that the circumferential edge of the wafer 3 cannot be wedged into the surface of the pushing pin body 9074.

An operation of the first embodiment having the structure described above will be described with reference to FIG. 4.

Figure 4:
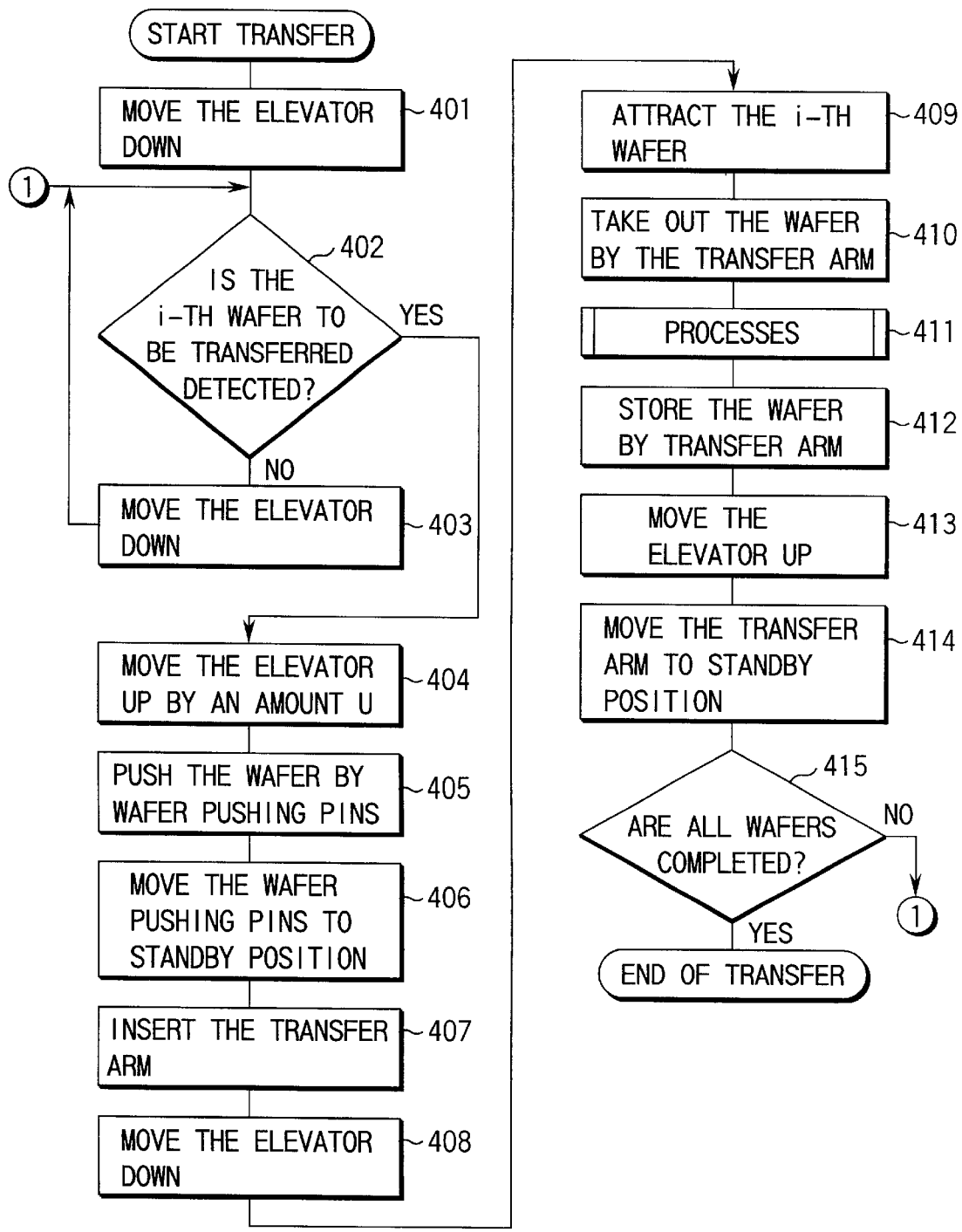
FIG. 4 is a flowchart for explaining an operation of the first embodiment.

FIG. 4 is a flowchart indicating a transfer operation of taking out wafers 3 from the wafer cassette 4 one by one and subjecting the wafer to another process. In this case, the wafer 3 i-th from the lowermost stage (hereinafter referred to the i-th wafer 3) is taken out. The circumferential edge thereof is wedged into back-around portions 701 of a slot groove 7. An operation of releasing the wedged state and transferring the i-th wafer 3 by a transfer arm 5 will be described. When the wafer cassette 4 is mounted on a cassette base 2 which can be moved up and down by an elevator mechanism portion 1, and a switch (not shown) is turned on to start transferring the wafer 3, an operation is performed through the procedures shown in the flowchart.

In the following description, it is assumed that i=n, an n-th wafer 3 is transferred, and the ori-fla of the n-th wafer 3 is present between the pushing pins 907 and 909.

First, the cassette base 2 is moved down by the elevator mechanism portion 1 (step S401).

Then, a sensor (not shown) determines whether the n-th wafer 3 in the wafer cassette 4 is detected (step S402).

If the n-th wafer 3 is not detected in the step S402, the cassette base 2 is further moved down by the elevator mechanism portion 1 (step S403), and the same operation is repeated until the n-th wafer is detected.

If the n-th wafer 3 is detected in the step S402, the cassette base 2 is moved up by a predetermined amount U (step S404).

In this case, at a position where the wafer pushing mechanism 9 can push out the n-th wafer 3, as shown in FIG. 1, the mechanism is set to a standby mode in which the pushing pins 907, 908 and 909 are separated from the wafer 3 within a range of a stroke of the sub-base 905 so as not to interfere with the n-th wafer 3. When the motor 902 is driven, the disk-shaped cam 903 eccentrically attached to the rotation shaft 9021 is rotated. The rotation force is converted to force for pushing the sub-base 905 by the contact between the disk-shaped cam 903 and the cam follower 906. Thus, the sub-base 905 is driven linearly toward the wafer inlet/outlet side of the wafer cassette 4 along the linear guide 904 against the attractive force of the spring 9061. When the sub-base 905 is driven linearly to the wafer inlet/outlet side, the pushing pins 907 and 909 are pressed against the circumferential edge of the wafer 3, bridging the ori-fla 3A of the n-th wafer 3. At this time, the pushing pin 908 does not contact to the circumferential edge of the wafer 3, as shown in FIG. 2. The pushing pins 907 and 909 are then rotated, while pushing the wafer 3, so that the engagement between the wafer 3 and the back-around portions 701 can be released (step S405).

The amount of pushing the wafer 3 by the pushing pins 907 and 909 can be adjusted by changing the size or the rotation angle of the disk-shaped cam 903. In this embodiment, an amount of a push of several millimeters is sufficient for the purpose of releasing the engagement.

Thereafter, when the disk-shaped cam 903 is further rotated by the motor 902 while being in contact with the cam follower 906, the sub-base 905 is moved along the linear guide 904 by the attractive force of the spring 9061 in a direction in which it is separated from the wafer cassette 4. The pushing pins 907, 908 and 909 are returned to the standby state as shown in FIG. 1 (step S406).

Then, the transfer arm 5 is inserted under the n-th wafer 3 (step S407), and the cassette base 2 is moved down by the elevator mechanism portion 1 (step S408). After the transfer arm 5 attracts and holds the n-th wafer 3 by the attracting portion 6 (step S409), the transfer arm 5 takes out the wafer 3 from the wafer cassette 4 (step S410).

The taken-out wafer 3 is transferred and subjected to various processes in accordance with the use, such as an inspection process (step S411). After the processes, the n-th wafer 3 is restored in the position from which it is taken out by the transfer arm 5 (S412). In a state where the attraction of the wafer 3 is released, the cassette base 2 is moved up by the elevator mechanism portion 1 (step S413). The circumferential edge portion of the n-th wafer 3 is held by the slot groove 7 and the transfer arm 5 is moved to the standby position (step S414). Thus, the operation of transferring the n-th wafer 3 is completed.

The same procedures as those described above are repeated with respect to all wafers 15 stored in the wafer cassette 4 (step S415), and the transfer process is ended.

In the above description, it is assumed that the ori-fla of the wafer 3 is present between the pushing pins 907 and 909. In contrast, if the ori-fla is present outside the portion between the pushing pins 907 and 909, all the pushing pins 907, 908 and 909 of the wafer pushing mechanism 9 are in contact with the circumferential edge portion of the wafer 3. If the ori-fla is present across either the pushing pin 907 or 909, the pushing pin 908 and one of the pushing pins 907 and 909 are in contact with the circumferential edge portion of the wafer 3 to press out the wafer.

With the wafer transfer apparatus described above, if the ori-fla of the wafer 3 is present between the pushing pins 907 and 909, the pushing pins 907 and 909 push out the circumferential edge portion of the wafer 3 with rotating. Therefore, variable positions of the pushing pins are always brought into contact with the circumferential edge of the wafer 3, so that the engagement between the wafer 3 and the back-around portions 701 can be released without engagement between the circumferential edge of the wafer 3 and the pushing pin body 9074 (9094). In addition, the durability of the pushing pins 907, 908 and 909 can be improved.

If the ori-fla of the wafer 3 is not present between the pushing pins 907 and 909, at least two pushing pins including the pushing pins 908 press out the circumferential edge portion of the wafer 3 with rotating. Therefore, the engagement between the wafer 3 and the back-around portions 701 can be released without engagement between the circumferential edge of the wafer 3 and the pushing pin body 9074 (9084, 9094).

Thus, wherever the ori-fla of the wafer 3 held by the slot groove 7 is present, the wafer can be pressed out by the same amount, thereby surely releasing the engagement. As a result, the transfer arm 5 can attract each wafer 3 in the free state in which the engagement of the wafer 3 with the wafer cassette 4 is released. Therefore, an attraction error can be prevented from occurring.

Further, since the pushing pins 907, 908 and 909 push the n-th wafer 3 by driving the motor 902, the push by the pushing pins 907, 908 and 909 can be controlled by controlling the drive of the motor 902. Therefore, it is easy to incorporate the pushing pins into the wafer transfer apparatus, and a stable operation without damaging wafers can be automated in the wafer transfer process.

The present invention is not limited to the first embodiment described above, but can be modified variously as described in the following sections (1) and (2) without changing the gist of the invention.

(1) In the first embodiment, the engagement is released each time the wafer 3 stored in the wafer cassette is transferred. However, to improve the throughput of the apparatus, the transfer process can be performed after simultaneously releasing the engagement of a plurality or all of the wafers 3 stored in the wafer cassette 4. This modification can be realized easily by lengthening the pins.

(2) In the first embodiment, the cassette base 2 is moved up and down by the elevator mechanism 1, without moving the transfer arm 5 up and down, to release the engagement and transfer each wafer 3 in the wafer cassette 4. However, it is possible to employ a structure for releasing the engagement and transferring each wafer by moving the pushing mechanism 9 and the transfer arm 5 up and down, instead of moving the cassette base 2 up and down.

Second Embodiment

In the structure of the first embodiment, wherever the ori-fla of the n-th wafer 3 is present, the engagement between the circumferential edge portion of the wafer 3 and the back-around portions 701 can be released.

However, the ori-flas of the wafers 3 stored in the wafer cassette 4 may be aligned, depending on the process. Further, as in the case of an 8-inch wafer, the wafer may have a notch, instead of an ori-fla.

As the second embodiment, a wafer transfer apparatus used only for these cases will be described.

Figure 5:
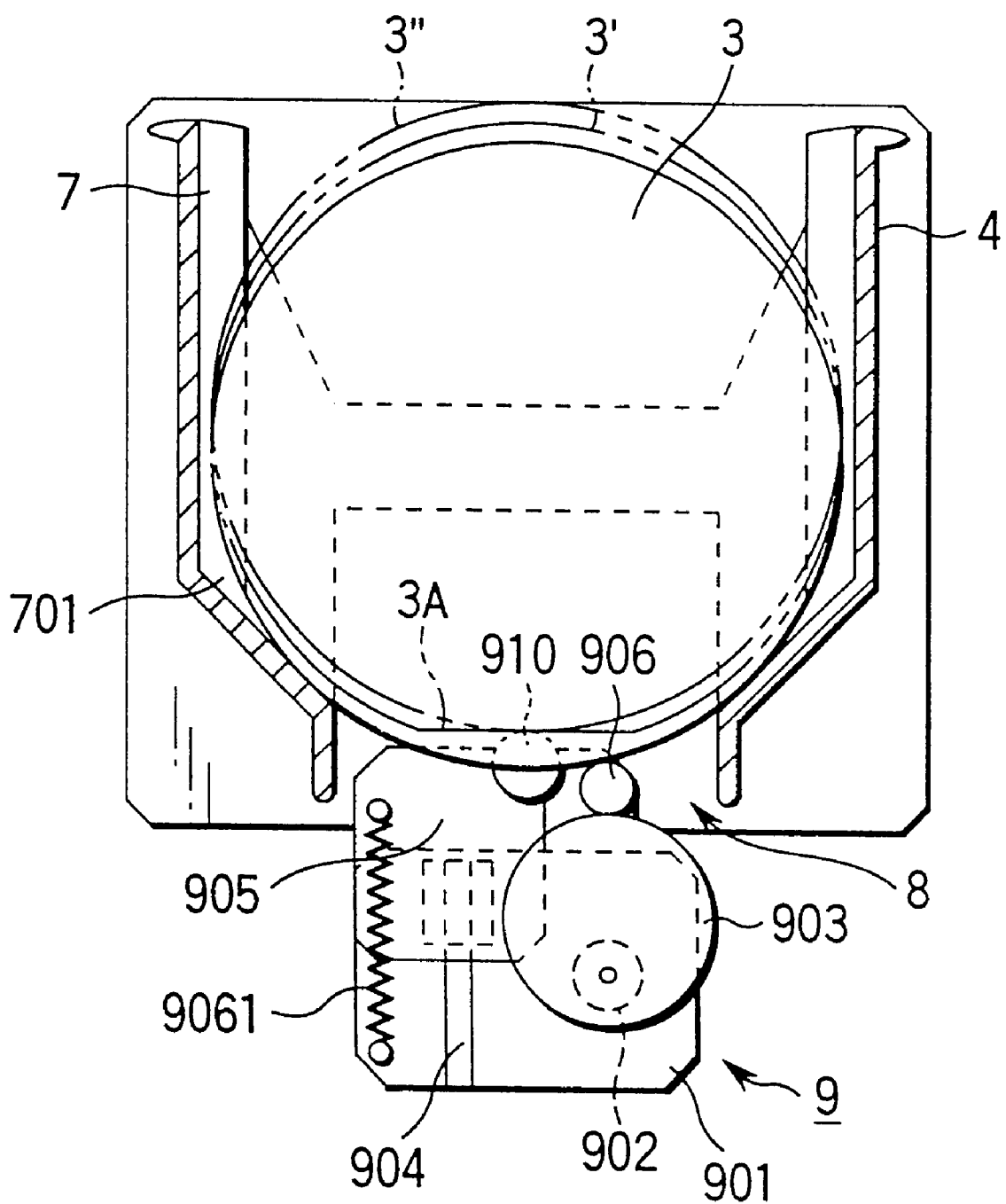
FIG. 5 shows a second embodiment of the present invention.

FIG. 5 is a schematic diagram showing a wafer transfer apparatus according to the second embodiment. The same elements as those shown in FIG. 1 are identified by the same reference numerals as those used in FIG. 1, and detailed descriptions thereof will be omitted.

In FIG. 5, a wafer pushing mechanism 9 faces a back-side opening 8 of a wafer cassette 4 and comprises a pushing pin 910 implanted in a sub-base 905. It is preferable that the diameter of the pushing pin 910 be much larger than the width of a notch in order to reduce the error in the amount of a push. In the same manner as in the first embodiment, when a motor 902 is driven, a disk-shaped cam 903 is rotated. The rotation causes the sub-base 905 to be driven linearly via a cam follower 906, and a pushing pin body 9074 of the pushing pin 910 to be brought into contact with the n-th wafer 3 with rotating. The sub-base pushes out the wafer 3, thereby releasing the engagement between the circumferential edge portion of the n-th wafer 3 and back-around portions 701.

If the wafers 3 are stored in the wafer cassette 4 in a state where the ori-flas face the back-side opening 8, when the wafer pushing mechanism 9 is driven, the pushing pin 910 is brought into contact with the ori-fla of the n-th wafer 3, releases the engagement of the wafer 3 and pushes the wafer to the position of the wafer 3' represented by the dot-chain line. Thus, the pushed distance of the wafer 3 is shorter by the ori-fla as compared to the case in which the ori-fla is not present between the pushing pins 907 and 909. As described before, the pushed distance can be changed by adjusting the size or the rotation angle of the disk-shaped cam 903.

If the wafers 3, having notches instead of ori-flas, are stored in a state where the notches face the back-side opening 8, when the wafer pushing mechanism 9 is driven, the pushing pin 910 is brought into contact with the wafer 3, releases the engagement of the wafer 3 and pushes the wafer to the position of the wafer 3" represented by the two dot-chain line. In this case, the pushed distance of the wafer 3 is substantially the same as that in the case where the ori-fla is not present between the pushing pins 907 and 909.

The pushed distance can also be changed in the same manner as described above. Further, since the pin 910 is much greater than the width of the notch, the amount of a push is constant regardless of whether there is a notch.

With the wafer transfer apparatus described above, even if the ori-flas of the wafers 3 are aligned toward the direction of the back-side opening 8 or the wafer 3 has a notch, the same effect as that of the first embodiment is obtained. In addition, since a pin suffices, the apparatus can be more simplified and more advantageous in cost as compared to the first embodiment.

The second embodiment can be modified in the same manner as in the first embodiment. More specifically, although the structure for pressing out one by one the wafers 3 stored in the wafer cassette 4 has been described as an example, the structure may simultaneously push out a plurality or all of the wafers. Further, it is possible to employ a structure for releasing the engagement and transferring each wafer 3 by moving the pushing mechanism 9 and the transfer arm 5 up and down, instead of moving the cassette base 2 up and down.

Third Embodiment

In the structures of the first and second embodiments, the engagement between the circumferential edge portion of the wafer 3 and the back-around portions 701 can be released by driving the wafer pushing mechanism 9 by the motor 902.

In contrast, the third embodiment has a structure in which the engagement between the circumferential edge portion of the wafer 3 and the back-around portions 701 is released by manually driving the pushing mechanism. A wafer transfer apparatus having such a pushing mechanism, more simplified and advantageous in cost, will be described below.

Figure 6:
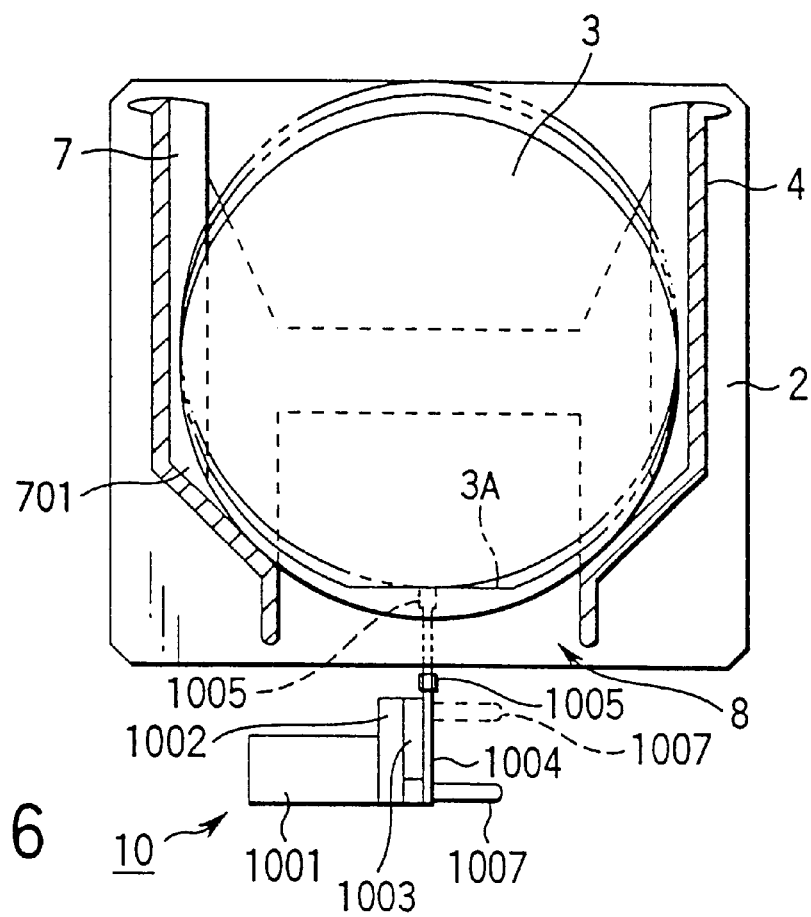
FIG. 6 shows a third embodiment of the present invention.
Figure 7:
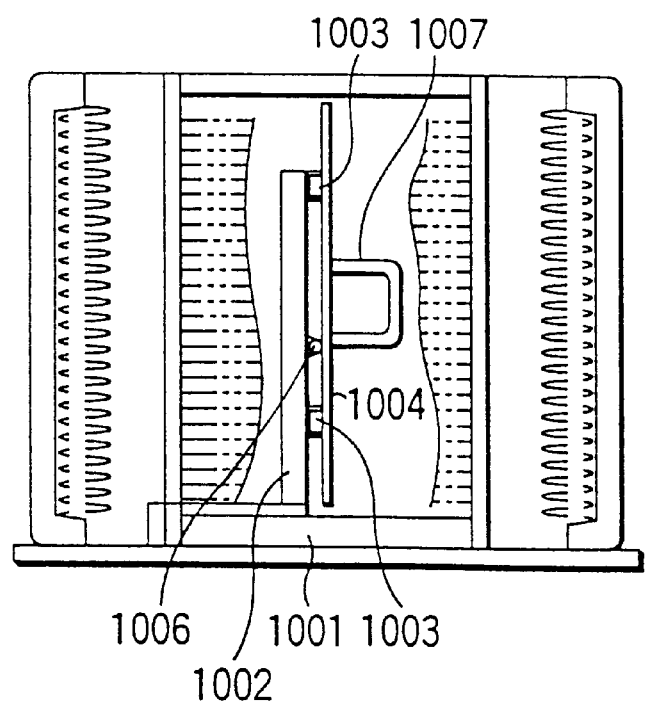
FIG. 7 shows the back side of the third embodiment of the present invention.

FIGS. 6 and 7 are schematic diagrams showing a wafer transfer apparatus according to the third embodiment. FIG. 6 is a cross sectional view similar to FIG. 1. FIG. 7 is a view of a wafer cassette 4 viewed from the side of a back-side opening 8. The same elements as those shown in FIG. 1 are identified by the same reference numerals as those used in FIG. 1, and detailed descriptions thereof will be omitted.

A general structure will be described first.

In FIGS. 6 and 7, a wafer pushing mechanism 10 faces the back-side opening 8 of the wafer cassette 4. The wafer pushing mechanism 9 comprises a base 1001 and a column 1002 mounted upright on the base 1001. A sub-bases 1004 is attached to upper and lower portions of the column 1002 via linear guides 1003.

A handle 1007 is attached to the sub-base 1004. The sub-base 1004 can be moved forward and backward relative to the back-side opening 8, along the direction of the linear guide 1003, by means of the handle 1007. The stroke of the sub-base 1004 moved manually is set to a length enough to surely release the engagement and push out the wafer 3 stored in the wafer cassette 4, in whatever direction the ori-fla of the wafer 3 faces.

A spring 1006 is interposed between the sub-base 1004 and the column 1002. Owing to the elastic force of the spring 1006, the sub-base 1004 is always returned to a standby position separated from the back-side opening 8.

In the front side of the sub-base 1004, facing the back-side opening 8, a plurality of wafer pushing pins 1005 are provided at positions corresponding to all the wafers stored in the wafer cassette 47, so that they can be pushed out.

The wafer cassette 4 is mounted on the cassette base 2. The operator pushes the handle 1007 to move the sub-base 1004 forward toward the back-side opening 8 against the elastic force of the spring 1006. By the forward movement, the wafer pushing pins 1005 attached to the sub-base 1004 are brought into contact with the circumferential edge portions of the wafers 3, and push the wafers to release the engagement.

When the pushing operation of the handle 1007 is released in this state, the sub-base 1004 is returned to the standby position separated from the back-side opening 8 of the cassette 4 by the elastic force of the spring 1006.

With the structure described above, since the wafer pushing mechanism 10 is driven by manual means, the overall structure of the wafer pushing mechanism 10 can be simplified and advantageous in cost. Further, since all the wafers 3 in the wafer cassette 4 can be released from the engagement by one pushing operation, the cycle time can be shortened.

The present invention is not limited to the third embodiment described above, but can be modified variously, for example, as described below.

In the third embodiment, the contact portion between the pushing pin 1005 and the wafer 3 may be rotatable in the same manner as in the case of pushing pin of the first and second embodiments.

With this structure also, the wafer can be pushed out, while the circumferential edge portion of the wafer 3 is prevented from engaging with the pushing pin 1005.

Industrial Applicability

As described in the first to third embodiments, the wafer is pushed out by the wafer pushing mechanism, thereby preventing the engagement between the circumferential edge portion of the wafer and the back-around portions of the slot groove. As a result, when the wafer is taken out from the wafer cassette, damage of the wafer or an attraction error of the transfer arm can be surely prevented, and wafers can be smoothly moved from one wafer cassette to another. Further, a transfer process can be performed even by a transport wafer cassette which has a narrow pitch width.

What is claimed is:

1. A wafer transfer apparatus for taking out a wafer from a groove of a wafer cassette by moving a wafer taking out arm relative to the wafer cassette, the wafer transfer apparatus comprising:

three rotatable pushing members;

wafer pushing out means for bringing at least two of said pushing members into contact with the wafer to be taken out at a rear end portion of the wafer cassette, and pushing out the wafer, thereby releasing engagement between the wafer and the groove of the wafer cassette; and transfer means for: (i) inserting the wafer taking out arm into the wafer cassette after releasing the engagement between the wafer and the groove of the wafer cassette, (ii) attracting the wafer to the arm, and (iii) taking out the wafer from the cassette.

2. The wafer transfer apparatus according to claim 1, wherein the pushing out means does not bring one of said pushing members into contact with the wafer.

3. The wafer transfer apparatus according to claim 1, wherein each of the pushing members is rotatable by a bearing structure.

4. The wafer transfer apparatus according to claim 1, wherein the wafer pushing out means comprises driving means for driving the pushing members linearly toward the wafer cassette.

5. The wafer transfer apparatus according to claim 4, wherein the wafer pushing out means operates the pushing members to simultaneously push out a plurality of wafers.

6. A wafer transfer apparatus for taking out a wafer from a wafer cassette by moving a wafer taking out arm relative to the wafer cassette, wherein the wafer cassette has grooves on both left and right sides thereof for holding circumferential edges of a plurality of wafers and an interval between the right and left grooves at a rear end part of the wafer cassette is narrower than an interval between the right and left grooves at a front end part of the wafer cassette, the wafer transfer apparatus comprising:

three rollers rotatable about an axis perpendicular to a surface of the wafer to be taken out;

pushing out means for pushing out the wafer by bringing at least two of the rollers into contact with the wafer at the rear end part of the wafer cassette; and transfer means for: (i) inserting the wafer taking out arm into the wafer cassette after the wafer is pushed, (ii) placing the wafer on the arm, (iii) attracting the wafer, and (iv) taking the wafer out from the cassette.

7. The wafer transfer apparatus according to claim 6, wherein two of the rollers are arranged at an interval wider than a width of an orientation-flat of the wafer.

8. The wafer transfer apparatus according to claim 6, wherein the pushing out means comprises:

a sub-base on which the pushing out member is mounted;

a base for holding the sub-base via a linear movement guide;

a spring for forcing the sub-base in a direction toward the base; and a motor-driven eccentric cam for separating the sub-base from the base against spring force and linearly moving the sub-base toward a side of the wafer cassette.

9. The wafer transfer apparatus according to claim 6, wherein the rollers have a length sufficient to push out one wafer.

10. The wafer transfer apparatus according to claim 6, wherein the rollers have a length sufficient to simultaneously push out a plurality of wafers.

11. The wafer transfer apparatus according to claim 6, wherein the rollers have a length sufficient to simultaneously push out all wafers in the wafer cassette.

12. A wafer apparatus for taking out a wafer from a wafer cassette by moving a wafer taking out arm relative to the wafer cassette, wherein the wafer cassette has grooves on both left and right sides thereof for holding circumferential edges of a plurality of wafers and an interval between the right and left grooves at a rear end part of the wafer cassette is narrower than an interval between the right and left grooves at a front end part of the wafer cassette, the wafer transfer apparatus comprising:

three rotatable pushing members;

wafer pushing out means for bringing at least two of said pushing members into contact with the wafer to be taken out at a rear end portion of the wafer cassette, and pushing out the wafer, thereby releasing engagement between the wafer and the right and left grooves of the wafer cassette; and transfer means for: (i) inserting the wafer taking out arm into the wafer cassette after pushing out the wafer, (ii) placing the wafer on the arm, (iii) attracting the wafer, and (iv) taking out the wafer from the cassette.

13. The wafer transfer apparatus according to claim 12, wherein two of the pushing members are arranged at an interval wider than a width of an orientation-flat of the wafer to be taken out.

14. The wafer transfer apparatus according to claim 12, wherein the pushing out means comprises:
   a sub-base on which the pushing out member is mounted;
   a base for holding the sub-base via a linear movement guide;
   a spring for forcing the sub-base in a direction toward the base; and
   a motor-driven eccentric cam for separating the sub-base from the base against spring force and linearly moving the sub-base toward a side of the wafer cassette.

15. The wafer transfer apparatus according to claim 12, wherein a length of each of the pushing members is substantially equal to a length of an opening of the cassette in a direction of stacking of the plurality of wafers.

16. A wafer transfer apparatus for taking out a wafer from a wafer cassette by moving a wafer taking out arm relative to the wafer cassette, wherein the wafer cassette has grooves on both left and right sides thereof for holding circumferential edges of a plurality of wafers and an interval between the right and left grooves at a rear end part of the wafer cassette is narrower than an interval between the right and left grooves at a front end part of the wafer cassette, the wafer transfer apparatus comprising:
   a pushing member comprising at least one roller rotatable about an axis perpendicular to a surface of the wafer to be taken out;
   pushing out means for pushing out the wafer by bringing the pushing member into contact with the wafer at the rear end part of the wafer cassette; and
   transfer means for: (i) inserting the wafer taking out arm into the wafer cassette after the wafer is pushed, (ii) placing the wafer on the arm, (iii) attracting the wafer, and (iv) taking the wafer out from the cassette;
   wherein the pushing out means comprises:
      a sub-base on which the pushing member is mounted;
      a base for holding the sub-base via a linear movement guide;
      a spring for forcing the sub-base in a direction toward the base; and
      a motor-driven eccentric cam for separating the sub-base from the base against spring force and linearly moving the sub-base toward a side of the wafer cassette.

17. A wafer apparatus for taking out a wafer from a wafer cassette by moving a wafer taking out arm relative to the wafer cassette, wherein the wafer cassette has grooves on both left and right sides thereof for holding circumferential edges of a plurality of wafers and an interval between the right and left grooves at a rear end part of the wafer cassette is narrower than an interval between the right and left grooves at a front end part of the wafer cassette, the wafer transfer apparatus comprising:
   three rotatable pushing members;
   wafer pushing out means for bringing at least two of said pushing members into contact with the wafer to be taken out at a rear end portion of the wafer cassette, and pushing out the wafer, thereby releasing engagement between the wafer and the right and left grooves of the wafer cassette; and
   transfer means for: (i) inserting the wafer taking out arm into the wafer cassette after pushing out the wafer, (ii) placing the wafer on the arm, (iii) attracting the wafer, and (iv) taking out the wafer from the cassette;
   wherein the pushing out means comprises:
      a sub-base on which the pushing members is mounted;
      a base for holding the sub-base via a linear movement guide;
      a spring for forcing the sub-base in a direction toward the base; and
      a motor-driven eccentric cam for separating the sub-base from the base against spring force and linearly moving the sub-base toward a side of the wafer cassette.

* * * * *